United States Patent
Sun

(10) Patent No.: US 9,721,869 B2
(45) Date of Patent: Aug. 1, 2017

(54) HEAT SINK STRUCTURE WITH HEAT EXCHANGE MECHANISM

(71) Applicant: COOLER MASTER CO., LTD., New Taipei (TW)

(72) Inventor: Chien-Hung Sun, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 214 days.

(21) Appl. No.: 14/662,656

(22) Filed: Mar. 19, 2015

(65) Prior Publication Data
US 2016/0219756 A1 Jul. 28, 2016

(30) Foreign Application Priority Data

Jan. 28, 2015 (TW) .............................. 104201378 U

(51) Int. Cl.
| | |
|---|---|
| *F28D 15/02* | (2006.01) |
| *H01L 23/427* | (2006.01) |
| *F28D 15/04* | (2006.01) |
| *F28F 1/00* | (2006.01) |
| *F28F 1/26* | (2006.01) |
| *F28F 1/30* | (2006.01) |
| H01L 23/367 | (2006.01) |
| H01L 21/48 | (2006.01) |

(52) U.S. Cl.
CPC ........ *H01L 23/427* (2013.01); *F28D 15/0233* (2013.01); *F28D 15/0275* (2013.01); *F28D 15/04* (2013.01); *F28F 1/006* (2013.01); *F28F 1/26* (2013.01); *F28F 1/30* (2013.01); *H01L 21/4882* (2013.01); *H01L 23/367* (2013.01)

(58) Field of Classification Search
CPC ............. F28D 15/0233; F28D 15/0275; F28D 15/046; H05K 7/20336; H01L 23/427
USPC ............ 165/104.13, 104.14, 104.26, 104.33; 361/700
See application file for complete search history.

(56) References Cited

U.S. PATENT DOCUMENTS

| | | | |
|---|---|---|---|
| 3,831,664 A * | 8/1974 | Pogson .................. | F28D 15/04 165/104.14 |
| 4,131,158 A * | 12/1978 | Abhat ................... | C09K 5/063 126/400 |

(Continued)

FOREIGN PATENT DOCUMENTS

| | | | | | |
|---|---|---|---|---|---|
| JP | | 55041358 A | * | 3/1980 | ......... F28D 15/0233 |
| JP | | 63217195 A | * | 9/1988 | |
| KR | WO 2013183937 A1 | * | 12/2013 | ........... F28D 7/0008 |

*Primary Examiner* — Allen Flanigan
(74) *Attorney, Agent, or Firm* — Mashoff Brennan

(57) ABSTRACT

The heat sink structure includes a vapor chamber, a heat pipe, and capillary elements. The vapor chamber includes a housing, a first capillary structure covering inside the housing, and a first working fluid filled inside the housing. The housing includes through holes and an inner top wall. Both ends of the heat pipe are inserted through the two through holes respectively and are exposed from the housing. The heat pipe includes a pipe body, a second capillary structure covering inside the pipe body, and a second working fluid filled inside the pipe body. Each of the capillary elements is connected to the inner top wall. One end of each of the capillary elements is in contact with the first capillary structure, and the other end of each of the capillary elements is in thermal contact with the heat pipe.

10 Claims, 7 Drawing Sheets

(56) References Cited

U.S. PATENT DOCUMENTS

| | | | | |
|---|---|---|---|---|
| 5,309,457 A | * | 5/1994 | Minch | F28D 15/0233 |
| | | | | 165/104.14 |
| 5,579,830 A | * | 12/1996 | Giammaruti | F28D 15/02 |
| | | | | 165/104.21 |
| 5,647,429 A | * | 7/1997 | Oktay | F28D 15/0275 |
| | | | | 165/104.14 |
| 5,655,598 A | * | 8/1997 | Garriss | F28D 15/0266 |
| | | | | 165/104.14 |
| 6,009,935 A | * | 1/2000 | Shiret | F28D 1/0226 |
| | | | | 165/104.14 |
| 8,339,786 B2 | * | 12/2012 | Cheng | H01L 23/427 |
| | | | | 165/104.14 |
| 2002/0050341 A1 | * | 5/2002 | Dussinger | F28D 15/0233 |
| | | | | 165/104.26 |
| 2008/0115911 A1 | * | 5/2008 | Duesterhoeft | H02S 40/345 |
| | | | | 165/104.21 |
| 2009/0260785 A1 | * | 10/2009 | Wang | B22F 5/003 |
| | | | | 165/170 |
| 2011/0297355 A1 | * | 12/2011 | Meyer, IV | F28D 15/0233 |
| | | | | 165/104.26 |

\* cited by examiner

HEAT SINK STRUCTURE WITH HEAT EXCHANGE MECHANISM

BACKGROUND

1. Technical Field

The present invention relates to a heat sink with a vapor chamber or a heat pipe and, in particular, to a heat sink structure with a heat exchange mechanism.

2. Related Art

With the development of technology, modern electronic devices have been developed toward the trend of lightweight, thinness, slimness, and compactness. Therefore, it is necessary to reduce the sizes of electronic components in the electronic devices. However, if the device size is reduced and the performance is enhanced, a great amount of heat is generated during operation of the electronic components. If the heat is not dissipated and accumulated on the electronic components, the electronic components may malfunction due to increasingly higher temperatures.

To dissipate heat generated by the electronic components, conventional techniques utilize a heat sink in thermal contact with the electronic component to dissipate heat to the ambient environment. The heat sink can include a heat conduction block and a heat pipe inserted through the heat dissipation block. The heat conduction block is in thermal contact with the electronic component, and the heat is dissipated out via the heat pipe. Alternatively, the heat sink can include a vapor chamber in direct thermal contact with the electronic component.

However, it is found that the existing electronic component collaborating with either a heat pipe or a vapor chamber is inadequate for use because the heat pipe has a problem of a high spreading resistance, and the vapor chamber has a problem of a narrow heat transferring direction range. Accordingly, industries are desirable to improve the heat sink to use the heat pipe and the vapor chamber together, so as to acquire the advantages of a low spreading heat resistance and a wide heat transferring direction range at the same time.

In view of the foregoing, the inventor made various studies to improve the above-mentioned problems, on the basis of which the present invention is accomplished.

BRIEF SUMMARY

It is an object of the present invention to provide a heat sink structure with a heat exchange mechanism, which integrates a heat pipe and a vapor chamber together, so as to dissipate out the heat inside the vapor chamber from both ends of the heat pipe, thereby enhancing the heat dissipation efficiency of the heat sink structure and having the advantages of a low spreading resistance and a wide heat transferring direction range at the same time.

Accordingly, the present invention provides a heat sink structure with a heat exchange mechanism, comprising: a vapor chamber, the vapor chamber including a housing, a first capillary structure covering inside the housing, and a first working fluid filled inside the housing, the housing including at least a pair of through holes and an inner top wall; at least one heat pipe disposed in the housing, two ends of the heat pipe being inserted through the two through holes respectively and exposed from the housing, the heat pipe including a pipe body, the heat pipe including a pipe body, a second capillary structure covering inside the pipe body and a second working fluid filled inside the pipe body; and a plurality of capillary elements connected to the inner top wall, one end of each of the capillary elements being in contact with the first capillary structure, the other end of each of the capillary elements being in thermal contact with the heat pipe.

The present invention further has effects as follows:

(a) Each capillary element is sandwiched between the inner top wall and the heat pipe, and each capillary element is in contact with the first capillary structure, so as to facilitate heat exchange for the vapor chamber and the heat pipe, thereby enhancing the heat dissipation efficiency of the heat pipe.

(b) Each capillary element contacts against the heat pipe, so that the heat pipe can be held in fixed position to achieve good structure stability of the heat sink structure.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Referring to FIGS. 1 to 9, the present invention provides a heat sink structure with a heat exchange mechanism. The heat sink structure 10 includes a vapor chamber 1, one or a plurality of heat pipes 2, and a plurality of capillary elements 3.

Figure 1:
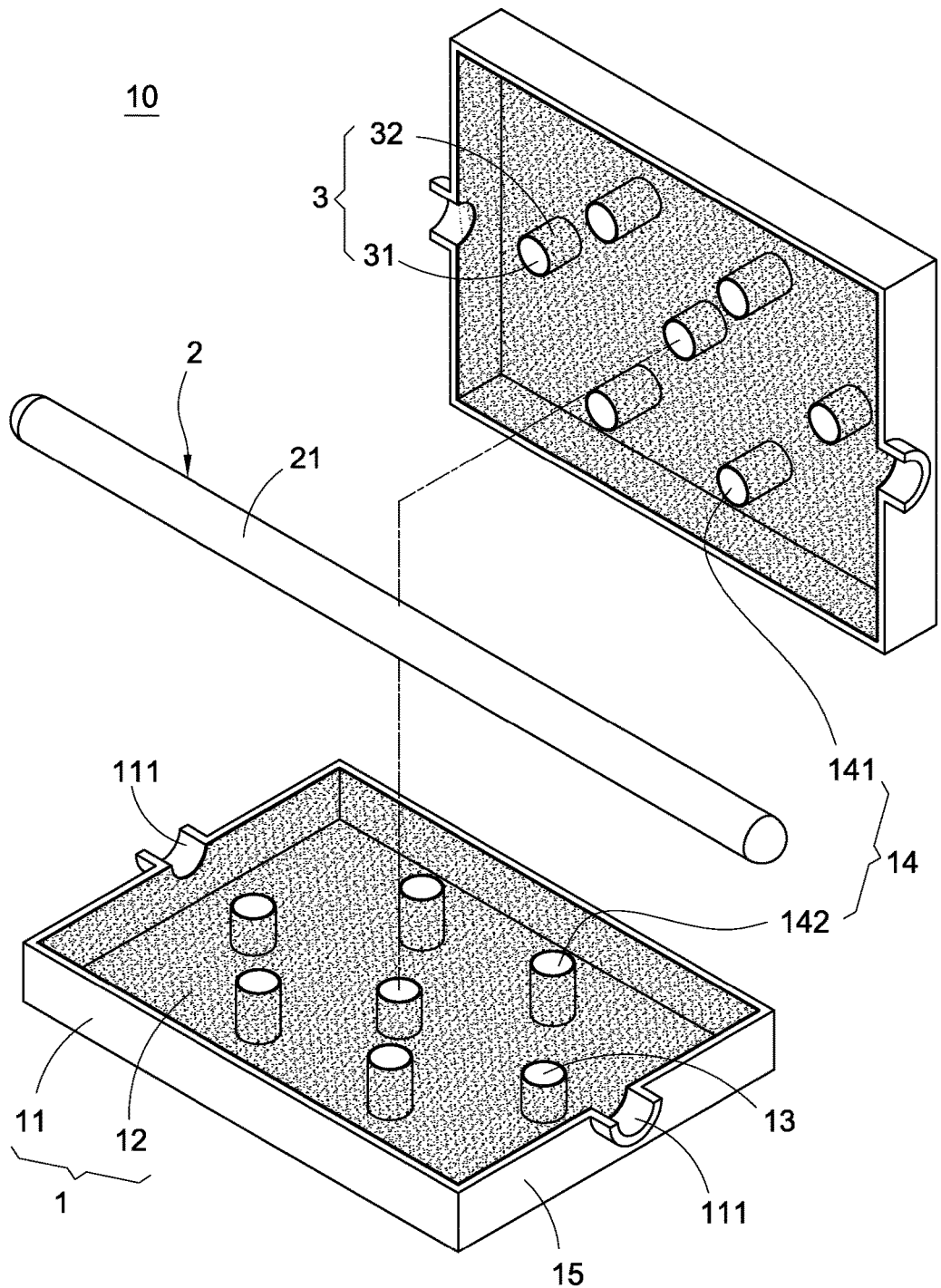
FIG. 1 is a perspective exploded view of a heat sink structure according to a first embodiment of the present invention.
Figure 2:
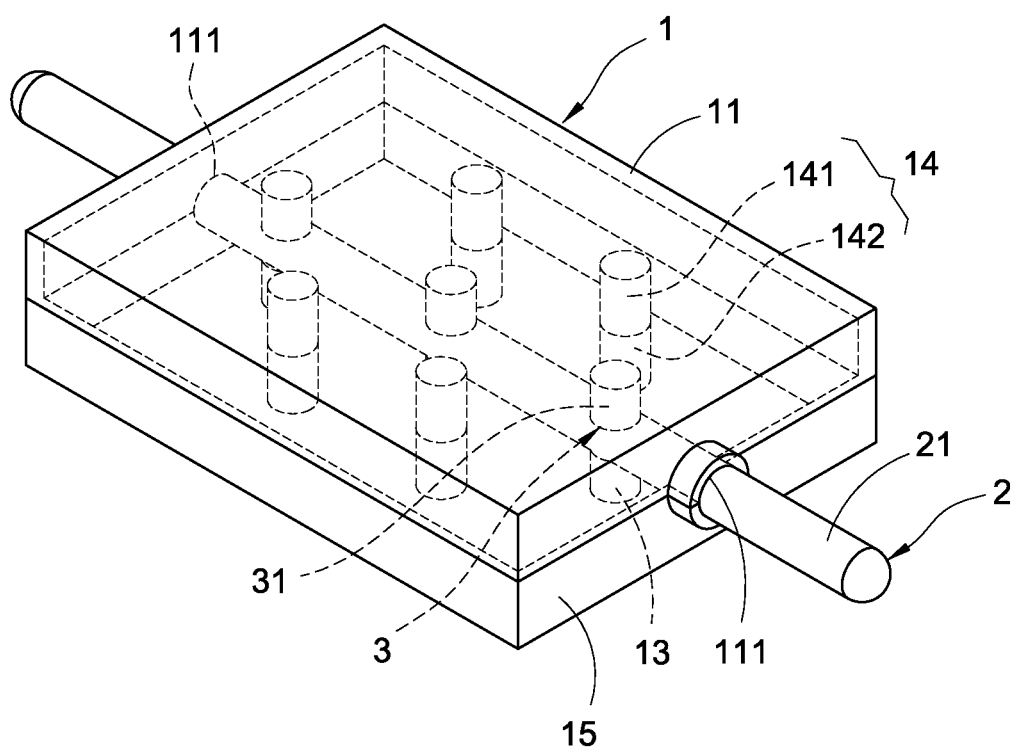
FIG. 2 is a perspective assembled view of the heat sink structure according to the first embodiment of the present invention.
Figure 3:
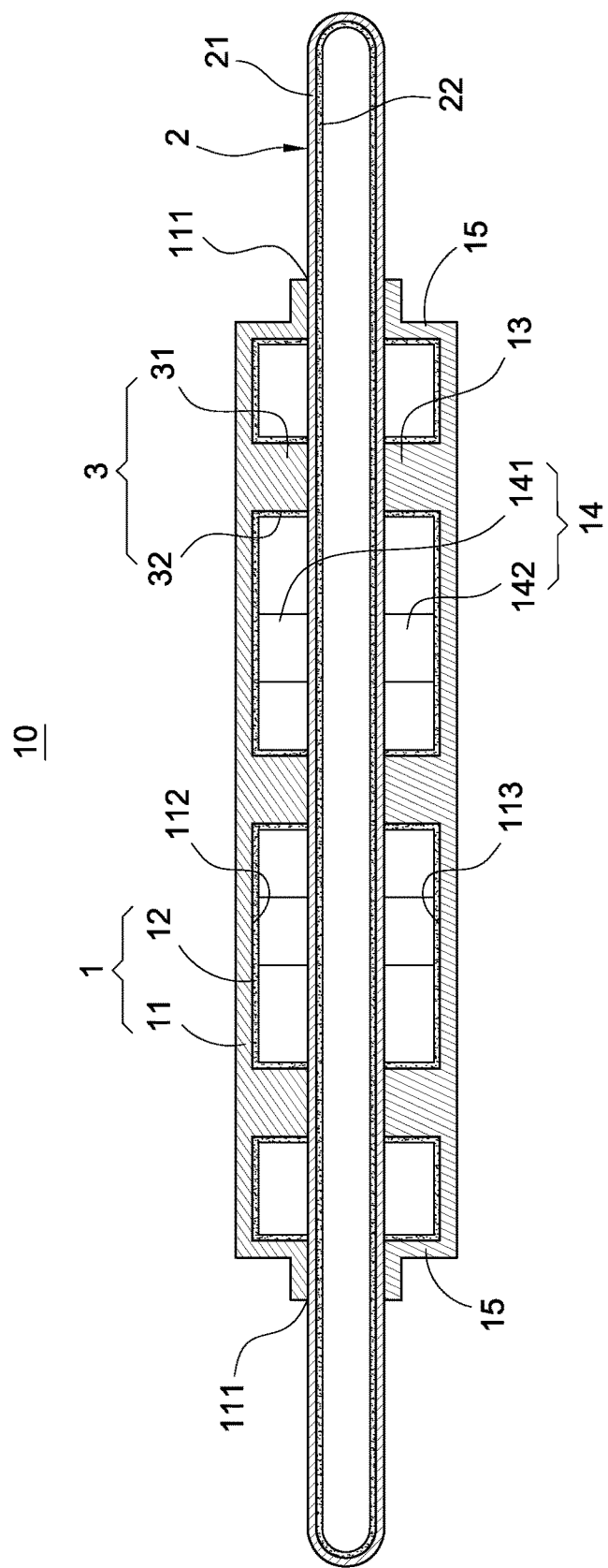
FIG. 3 is a cross-sectional view of the heat sink structure according to the first embodiment of the present invention.

Referring to FIGS. 1 to 3, the vapor chamber 1 includes a housing 11, a first capillary structure 12 covering inside the housing 11, and a first working fluid filled inside the housing 11. The housing 11 includes one or a plurality of pairs of through holes 111 and an inner top wall 112. The first capillary structure 12 consists of sintered particles, a metallic web, grooves, or a combination thereof. The first working fluid can be pure water or methyl alcohol.

In detail, the housing 11 further includes an inner bottom wall 113. According to the present embodiment, the housing 11 is formed by an upper housing and a lower housing assembled together; however, the present invention is not limited thereto. The inner top wall 112 is formed on the upper housing, and the inner bottom wall 113 is formed on the lower housing.

Furthermore, a plurality of support pillars 13 extend from the housing 11 and are disposed between the inner bottom wall 113 and the heat pipe 2, and the first capillary structure 12 covers outside each of the support pillars 13.

Moreover, a plurality of support bodies 14 extend from the housing 11 and are disposed between the inner top wall 112 and the inner bottom wall 113. The first capillary structure 12 covers outside each of the support bodies 14. In detail, each of the support bodies 14 includes a first protruding pillar 141 extending downward from the inner top wall 112 and includes a second protruding pillar 142 extending upward from the inner bottom wall 113, and each of the first protruding pillars 141 contacts against each of the second protruding pillars 142.

Figure 4:
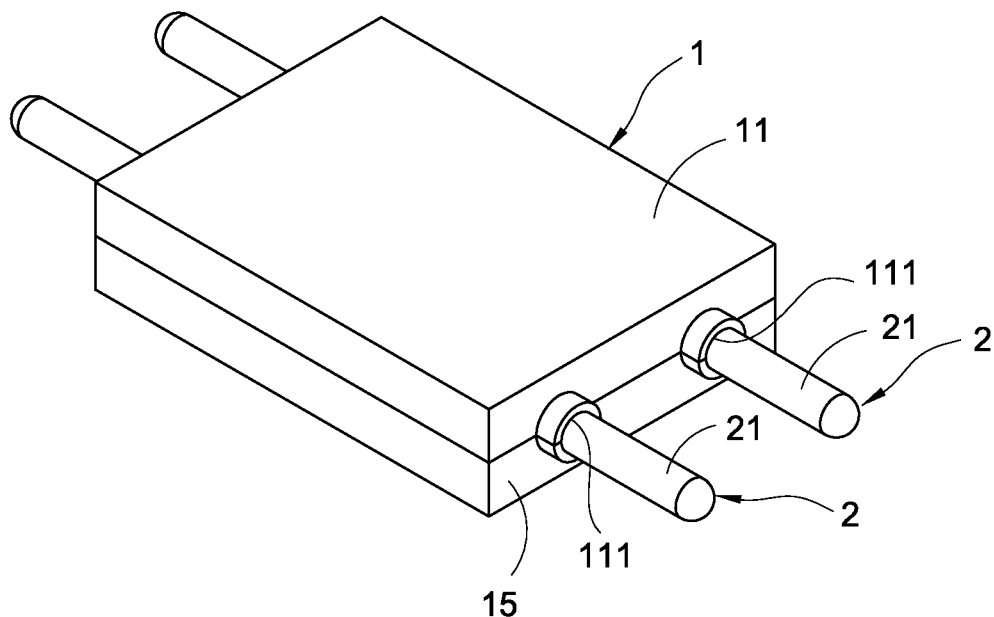
FIG. 4 is a perspective assembled view of the heat sink structure according to a second embodiment of the present invention.

Referring to FIGS. 1 to 3, the heat pipe 2 is disposed in the housing 11. Two ends of the heat pipe 2 are inserted through the two through holes 111 respectively and exposed from the housing 11. The heat pipe 2 includes a pipe body 21, a second capillary structure 22 covering inside the pipe body 21, and a second working fluid filled inside the pipe body 21. An inside of the vapor chamber 1 does not communicate with an inside of the heat pipe 2. As shown in FIGS. 2 and 4, there may be one or a plurality of pairs of the heat pipes, so there also may be one or a plurality of pairs of the heat pipes, corresponding to the number of the heat pipes 2. The second capillary structure 22 consists of sintered particles, a metallic web, grooves, or a combination thereof. The second working fluid can be pure water or methyl alcohol.

Figure 8:
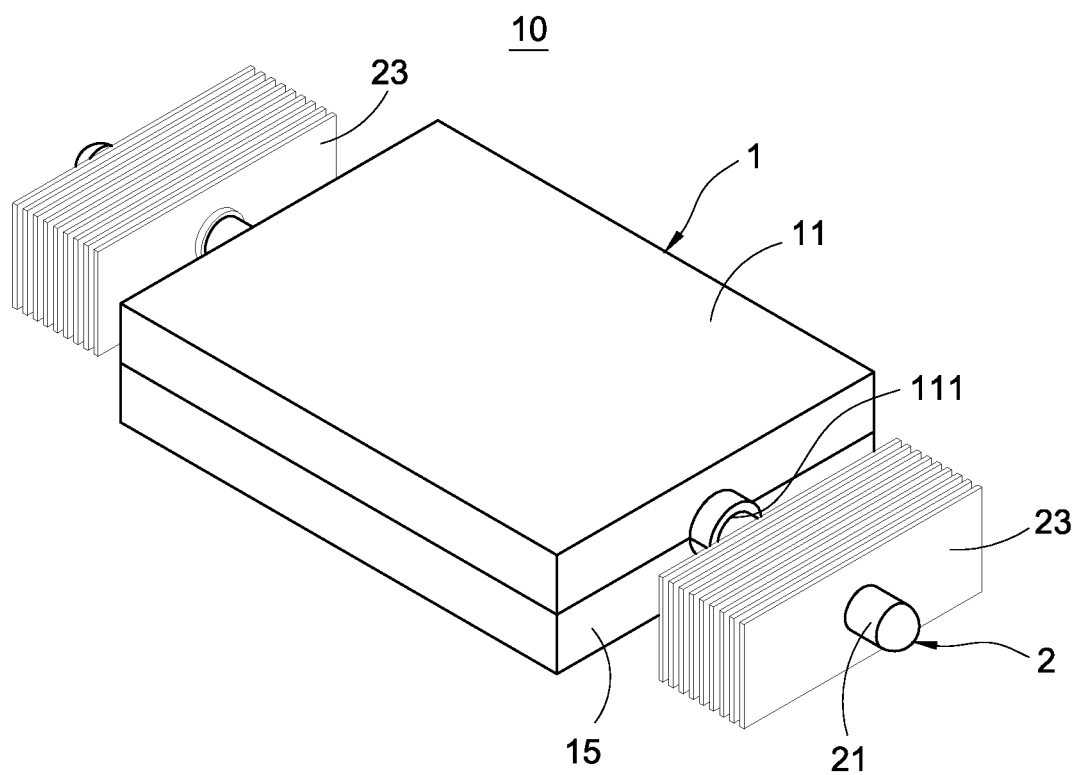
FIG. 8 is a perspective assembled view of the heat sink structure according to a sixth embodiment of the present invention.
Figure 9:
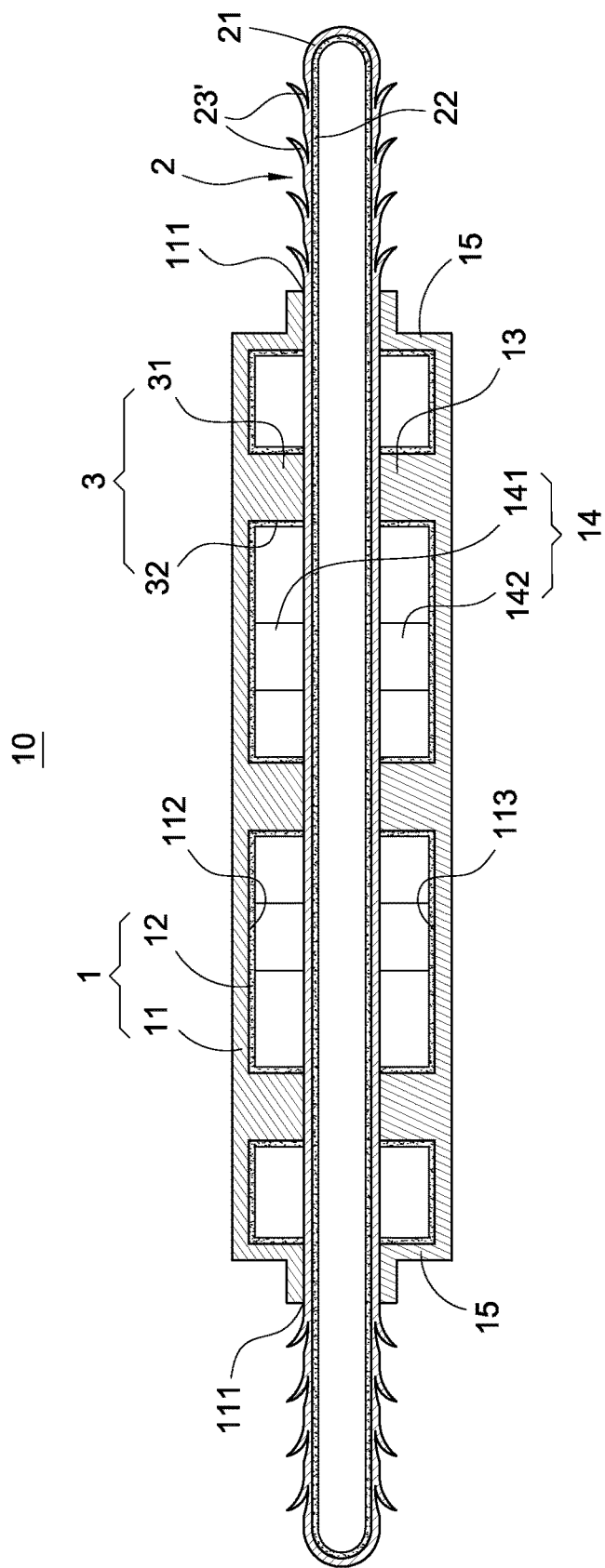
FIG. 9 is a cross-sectional view of the heat sink structure according to a seventh embodiment of the present invention.

Moreover, as shown in FIG. 8, the two ends of the heat pipe 2 exposed from the housing are inserted in a plurality of heat dissipation fins 23. As shown in FIG. 9, a plurality of heat dissipation fins 23' are formed by skiving (by means of skived-fin technology) the two ends of the heat pipe 2 exposed from the housing 11.

Furthermore, as shown in FIG. 2 and FIGS. 5 to 7, the pipe body 21 is in a linear shape, an L shape, a U shape, a wave-like shape, or any other suitable shape.

Figure 5:
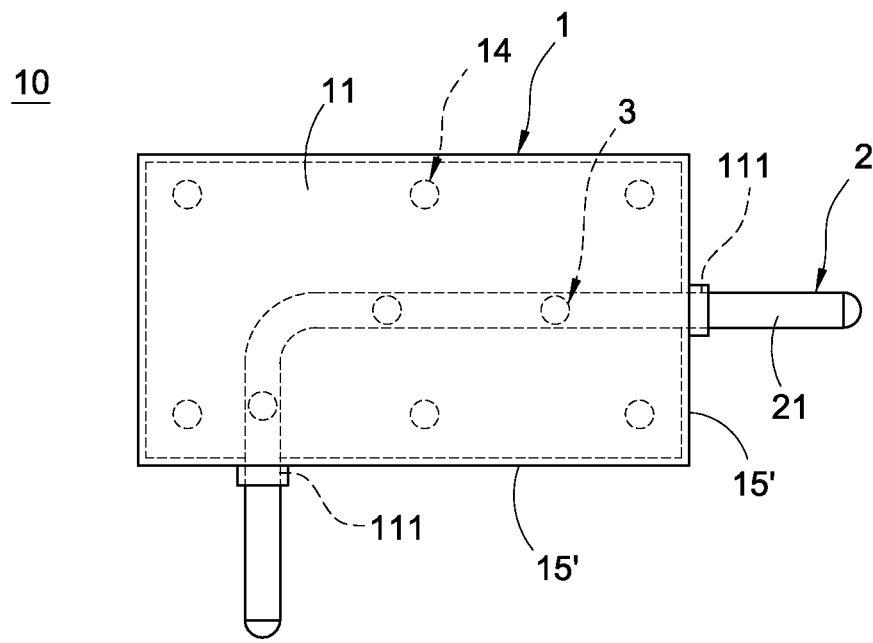
FIG. 5 is a schematic assembled view of the heat sink structure according to a third embodiment of the present invention.
Figure 6:
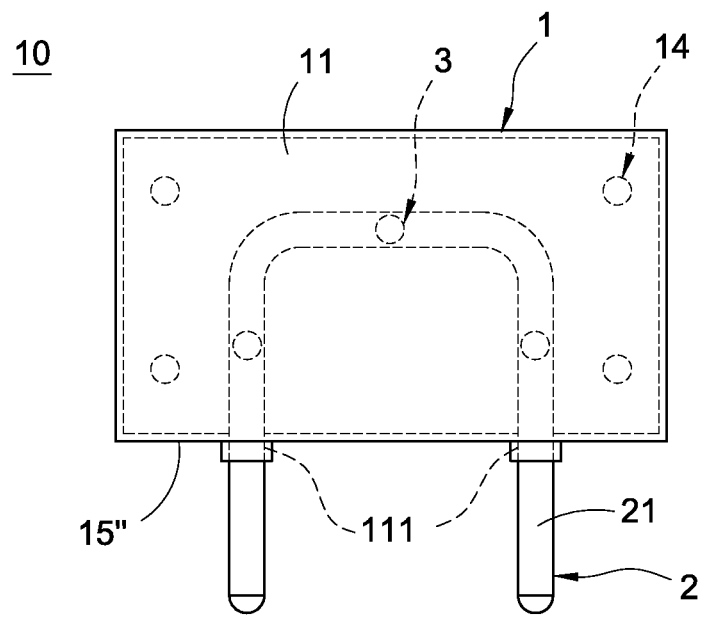
FIG. 6 is a schematic assembled view of the heat sink structure according to a fourth embodiment of the present invention.
Figure 7:
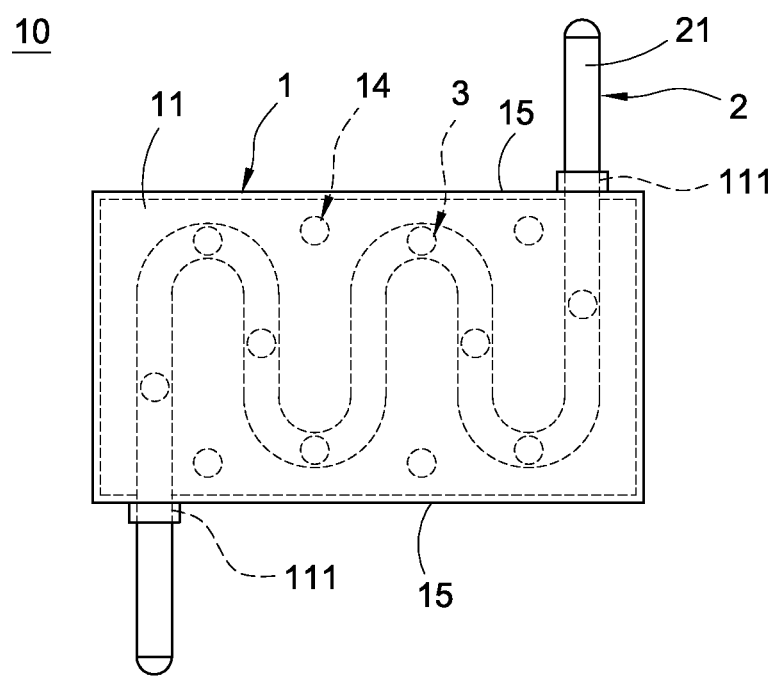
FIG. 7 is a schematic assembled view of the heat sink structure according to a fifth embodiment of the present invention.

Moreover, the two through holes 111 are disposed corresponding to the shape of the pipe body 21. Referring to FIG. 2, the pipe body 21 has a linear shape. The two through holes 111 are formed on two opposite side walls 15 of the housing 11. Referring to FIG. 5, the pipe body 21 has an L shape, and the two through holes 111 are formed on two adjacent side walls 15' of the housing 11. Referring to FIG. 6, the pipe body 21 has a U shape, and the two through holes 111 are formed on the same side wall 15" of the housing 11.

Referring to FIGS. 1 to 3, each of the capillary elements 3 is connected to the inner top wall 112, one end of each of the capillary elements 3 is in contact with the first capillary structure 12, and the other end of each of the capillary elements 3 is in thermal contact with the heat pipe 2. Each of the capillary elements 3 includes an extending pillar 31 extending downward from the inner top wall 112 and includes a third capillary structure 32 covering outside the extending pillar 31, and the first capillary structure 12 and the third capillary structure 32 are connected integrally with each other. Therefore, the third capillary structure 32 and the first capillary structure 12 are the same, so the third capillary structure 32 consists of sintered particles, a metallic web, grooves, or a combination thereof.

Further, each of the support pillars 13 is disposed corresponding to each of the capillary elements 3. That is to say, each support pillar 13 and each capillary element 3 are sandwiched on and under the heat pipe 2 respectively.

As shown in FIGS. 1 to 3, the present invention provides the heat sink structure 10, comprising: the vapor chamber 1, the vapor chamber 1 including the housing 11, the first capillary structure 12 covering inside the housing 11, and the first working fluid filled inside the housing 11, the housing 11 including the pair of through holes 111 and the inner top wall 112; the heat pipe 2 disposed in the housing 11, the two ends of the heat pipe 2 being inserted through the two through holes 111 respectively and exposed from the housing 11, the heat pipe 2 including the pipe body 21, the second capillary structure 22 covering inside the pipe body 21 and the second working fluid filled inside the pipe body 21; the plurality of the capillary elements 3 connected to the inner top wall 112, one end of each of the capillary elements 3 being in contact with the first capillary structure 12, the other end of each of the capillary elements 3 being in thermal contact with the heat pipe 2. Accordingly, the heat pipe 2 and the vapor chamber 1 are combined to work together, so as to dissipate out the heat inside the vapor chamber 1 from the two ends of the heat pipe 2, thereby enhancing the heat dissipation efficiency of the heat sink structure 10 and having the advantages of a low spreading heat resistance and a wide heat transferring direction range at the same time.

Please refer to FIGS. 1 to 3, showing the use state of the heat sink structure 10. The heat pipe 2 is disposed in the housing 11, the two ends of the heat pipe 2 are inserted through the two through holes respectively and exposed from the housing 11, and the heat inside the vapor chamber 1 is dissipated out from the two ends of the heat pipe 2. Therefore, the heat sink structure 10 has the feature of the low spreading heat resistance of the vapor chamber 1 and also has the feature of the wide heat transferring direction range of the heat pipe 2, and thus the heat dissipation efficiency of the heat sink structure 10 is enhanced.

Moreover, each of the capillary elements 3 is connected to the inner top wall 122, one end of each of the capillary elements 3 is in contact with the first capillary structure 12, and the other end of each of the capillary elements 3 is in thermal contact with the heat pipe 2. Therefore, after the first working fluid is cooled and condensed into a liquid phase, the first working fluid in the liquid phase can flow to the heat pipe along the capillary element 3 to lower the temperature of the heat pipe 2, thereby facilitating fast heat exchange for the vapor chamber 1 and the heat pipe 2 to increase the heat dissipation effect of the heat pipe 2.

Furthermore, each of the capillary elements 3 contacts against the heat pipe 2, so the heat pipe 2 is held in position by the capillary elements 3, and thereby the heat sink structure 10 can obtain excellent structure stability.

In summary, the heat sink structure with the heat exchange mechanism according to the present invention certainly can achieve the anticipated objects and improve the defects of the traditional techniques, and has industry applicability, novelty and non-obviousness, so the present invention completely meet the requirements of patentability. Therefore, a request to patent the present invention is filed according to patent laws. Examination is kindly requested, and allowance of the present application is solicited to protect the rights of the inventor.

What is claimed is:
1. A heat sink structure with a heat exchange mechanism, comprising:
 a vapor chamber, the vapor chamber including a housing,
  a first capillary structure covering inside the housing, and a first working fluid filled inside the housing, the housing including at least a pair of through holes and an inner top wall;

at least one heat pipe disposed in the housing, two ends of the heat pipe being inserted through the two through holes respectively and exposed from the housing, the heat pipe including a pipe body, a second capillary structure covering inside the pipe body and a second working fluid filled inside the pipe body; and a plurality of capillary elements connected to the inner top wall, one end of each of the capillary elements being in contact with the first capillary structure, the other end of each of the capillary elements being in thermal contact with the heat pipe.

2. The heat sink structure with the heat exchange mechanism of claim 1, wherein each of the capillary elements includes an extending pillar extending downward from the inner top wall and includes a third capillary structure covering outside the extending pillar, and the first capillary structure and the third capillary structure are connected integrally with each other.

3. The heat sink structure with the heat exchange mechanism of claim 1, wherein the housing includes an inner bottom wall, a plurality of support pillars extend from the housing and are disposed between the inner bottom wall and the heat pipe, and the first capillary structure covers outside each of the support pillars.

4. The heat sink structure with the heat exchange mechanism of claim 3, wherein each of the support pillars is disposed corresponding to each of the capillary elements.

5. The heat sink structure with the heat exchange mechanism of claim 1, wherein the housing includes an inner bottom wall, a plurality of support bodies extend from the housing and are disposed between the inner top wall and the inner bottom wall, and the first capillary structure covers outside each of the support bodies.

6. The heat sink structure with the heat exchange mechanism of claim 5, wherein each of the support bodies includes a first protruding pillar extending downward from the inner top wall and includes a second protruding pillar extending upward from the inner bottom wall, and each of the first protruding pillars contacts against each of the second protruding pillars.

7. The heat sink structure with the heat exchange mechanism of claim 1, wherein the two through holes are formed on two opposite side walls, two adjacent side walls, or the same one side wall of the housing.

8. The heat sink structure with the heat exchange mechanism of claim 1, wherein the pipe body is in a linear shape, an L shape, a U shape, or a wave-like shape.

9. The heat sink structure with the heat exchange mechanism of claim 1, wherein the two ends of the heat pipe exposed from the housing are inserted in a plurality of heat dissipation fins.

10. The heat sink structure with the heat exchange mechanism of claim 1, wherein a plurality of heat dissipation fins formed by skiving the two ends of the heat pipe exposed from the housing.

* * * * *